(12) United States Patent
Lu

(10) Patent No.: US 6,218,693 B1
(45) Date of Patent: *Apr. 17, 2001

(54) DYNAMIC RANDOM ACCESS MEMORY (DRAM) CELL HAVING A BURIED HORIZONTAL TRENCH CAPACITOR BY A NOVEL FABRICATION METHOD

(75) Inventor: Chih-Yuan Lu, Hsin-chu (TW)

(73) Assignee: Vanguard International Semiconductor Corporation, Hsin-Chu (TW)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/163,384

(22) Filed: Sep. 30, 1998

Related U.S. Application Data

(62) Division of application No. 08/939,971, filed on Sep. 29, 1997, now Pat. No. 5,843,820.

(51) Int. Cl.[7] .......................... H01L 27/108; H01L 29/76; H01L 29/94; H01L 31/119

(52) U.S. Cl. .......................... 257/296; 257/300; 257/301

(58) Field of Search .................................... 257/296–313; 438/243–253

(56) References Cited

U.S. PATENT DOCUMENTS

| | | | |
|---|---|---|---|
| 4,649,625 | * 3/1987 | Lu ........................................ | 257/301 |
| 4,728,623 | * 3/1988 | Lu et al. ............................... | 257/301 |
| 4,896,293 | 1/1990 | McElroy ................................ | 365/149 |
| 5,112,771 | 5/1992 | Ishii et al. ............................. | 437/67 |
| 5,418,177 | 5/1995 | Choi ...................................... | 437/52 |

OTHER PUBLICATIONS

Wolf, "Silicon Processing for the VLSI Era" vol. 2, Lattice Press, Sunset Beach, CA 1990, p605–611.

Device Electronic for Integrated Circuits Second Edition p. 94, 95 Mullur et al. Printed by John Wiley & Sons, Inc, 1986.*

* cited by examiner

Primary Examiner—Sara Crane
Assistant Examiner—Cuong Quang Nguyen
(74) Attorney, Agent, or Firm—George O. Saile; Stephen B. Ackerman

(57) ABSTRACT

An improved dynamic random access memory (DRAM) cell using a novel buried horizontal trench capacitor was achieved. A capacitor trench is etched in a silicon substrate. A first high-k dielectric layer is formed on the trench surface, and the trench is filled with a first polysilicon layer and polished back. A second high-k dielectric is deposited and patterned over the polySi-filled trench. A $P^-$ epitaxy is grown on the substrate that also grows inward over the trench, while an amorphous silicon layer of decreasing top surface area grows on the dielectric over the trench. A field oxide is formed in the epi surrounding and isolating a device area aligned over the trench capacitor. A node contact hole is etched in the epi/amorphous Si to the capacitor and has an oxide liner on the sidewall. A second polySi is deposited and etched back to form the node contact to the buried trench capacitor. The gate electrode (access transistor) is formed on the epi layer over the capacitor, and adjacent to the node contact which is connected to one of the two FET source/drain (S/D) areas, while the second S/D is connected to a bit line. The surface over the cell, free for the bit line, and the FET over the capacitor reduces the cell size, while the buried horizontal trench capacitor increases capacitance.

12 Claims, 5 Drawing Sheets

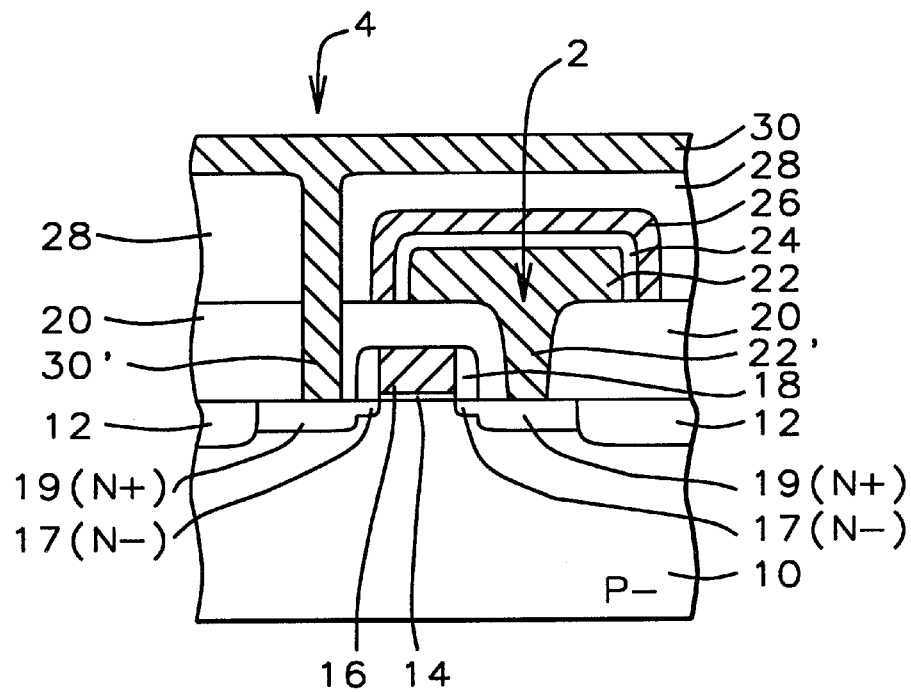
FIG. 1 — Prior Art
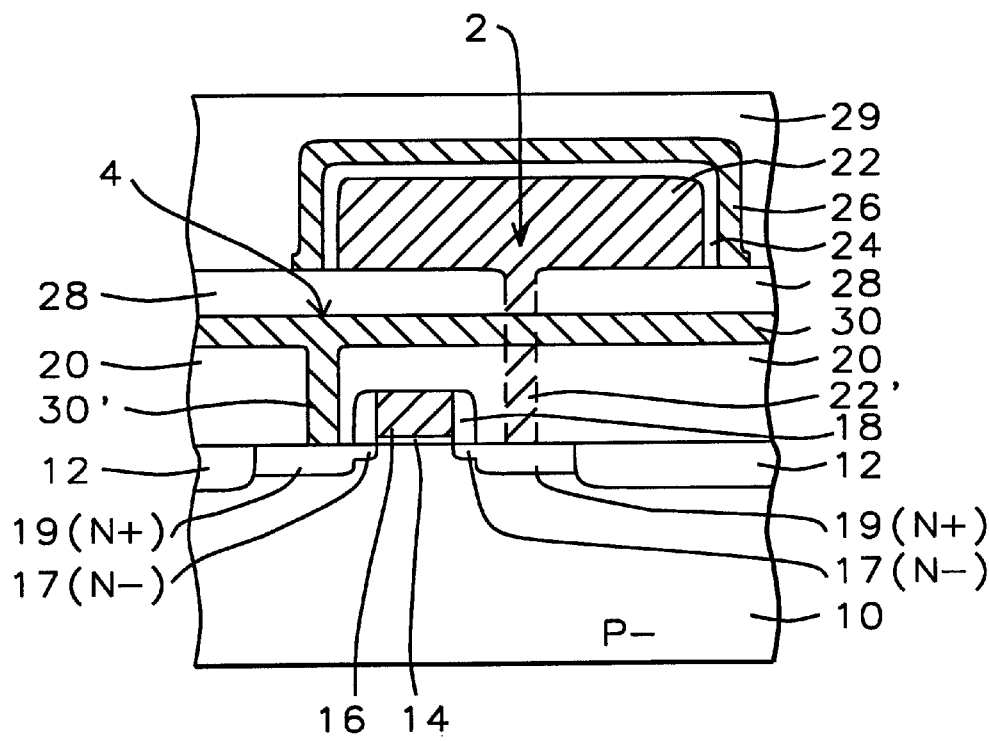
FIG. 2 — Prior Art

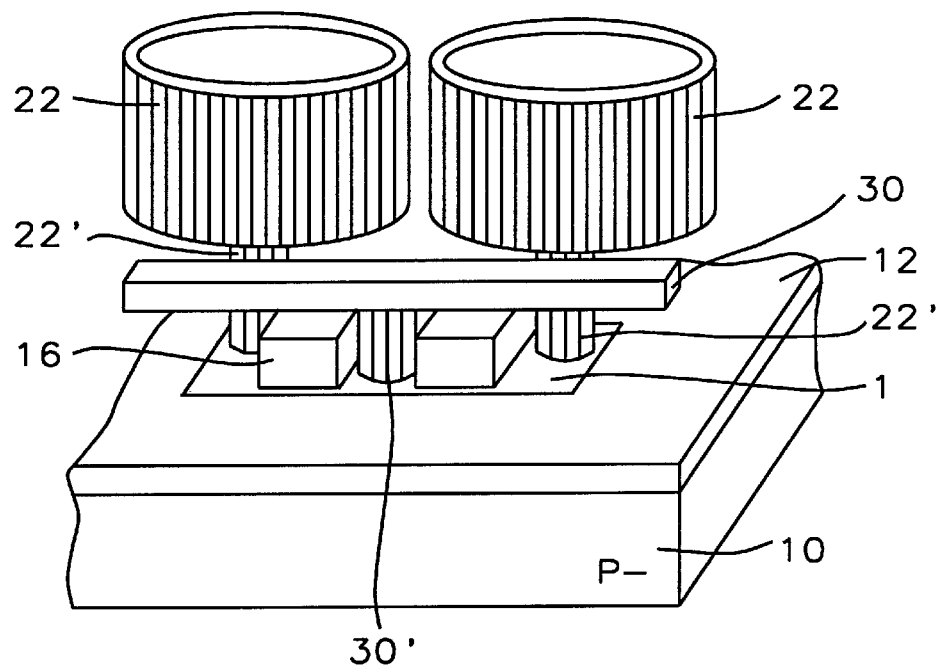
FIG. 3 – Prior Art
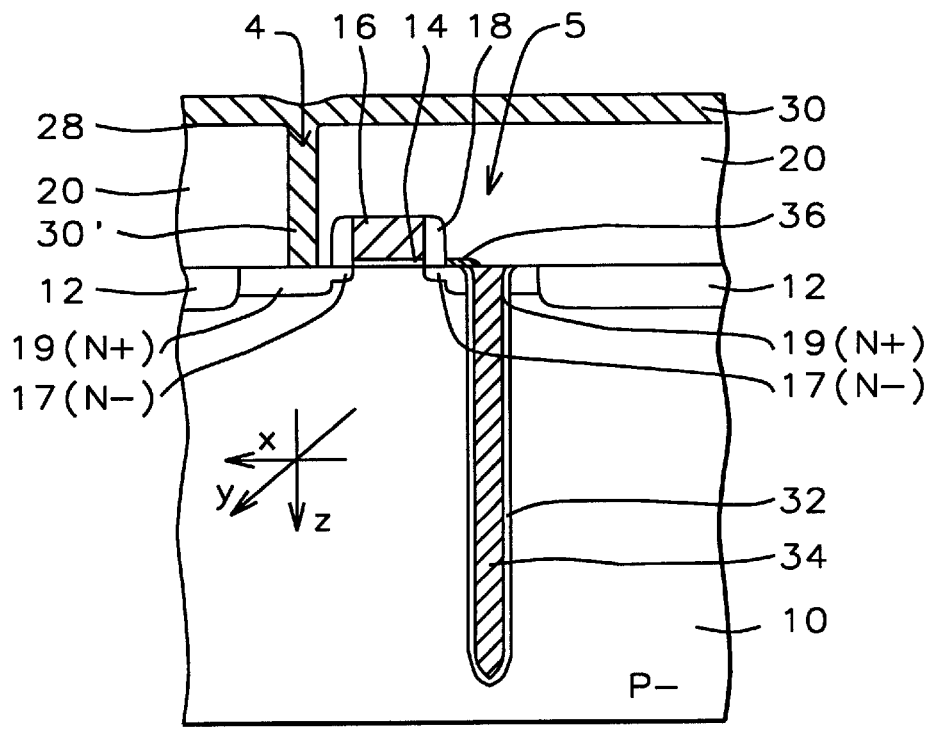
FIG. 4 – Prior Art

DYNAMIC RANDOM ACCESS MEMORY (DRAM) CELL HAVING A BURIED HORIZONTAL TRENCH CAPACITOR BY A NOVEL FABRICATION METHOD

RELATED PATENT APPLICATIONS

This a division of U.S. patent application Ser. No. 08/939,971, filing date Sep. 29, 1997 now U.S. Pat. No. 5,843,820, A New Dynamic Random Access Memory (Dram) Cell Having A Buried Horizontal Trench Capacitor By A Novel Fabrication Method, assigned to the same assignee as the present invention. U.S. Ser. No. 08/964,808 now U.S. Pat. No. 5,943,481 filed Nov. 15, 1999 entitled A METHOD FOR MAKING BURIED RESERVOIR CAPACITORS FOR HIGH-DENSITY DRAM CIRCUITS by C. Y. Lu and J. Sung.

BACKGROUND OF THE INVENTION

(1) Field of the Invention

This invention relates to an integrated circuit semiconductor device, and more particularly to a structure and a method for fabricating a new dynamic random access memory (DRAM) cell having a horizontally extending trench storage capacitor.

(2) Description of the Prior Art

Dynamic random access memory (DRAM) devices are used for storing digital information on arrays of memory cells in the form of charge stored on a capacitor. Each memory cell consists of a single access transistor and a single storage capacitor. The access transistors are usually N-channel field effect transistors (FETs) and are electrically connected by word lines to the peripheral address circuits. The storage capacitors are formed either by etching trenches in the substrate in each of the cell areas, commonly referred to as trench capacitors, or are formed over the access transistors in the cell areas by depositing and patterning conducting layers over the access transistors, and are commonly referred to as stacked capacitors. The capacitors make electrical contact to one of the two source/drain areas (node contact) of each FET, while bit lines make electrical contact to the other source/drain area of each FET. It is necessary that each capacitor lie within an area no larger than the size of the cell area in order to accommodate all the capacitors in the large array of cells used on the DRAM device.

It is becoming increasingly difficult to fabricate more memory cells on a DRAM device while limiting the overall DRAM device area to a practical size without decreasing the cell area. For example, after the year 2000 the number of memory cells is expected to reach 1 gigabit. Further, as the cell area decreases, the available area for the storage capacitor in each cell also decreases. This makes it difficult to maintain sufficient capacitance to provide the necessary signal-to-noise ratio. Also, the refresh cycle time necessary to maintain sufficient charge on these capacitors also decreases, resulting in DRAM devices with reduced performance (speed).

One method in the semiconductor industry of overcoming the above problems is to form DRAM devices having stacked capacitors. These types of capacitors extend vertically upward (z-direction) over the pass transistors and can be made with increased area in the z-direction while minimizing the area in the x-y directions, that is, along the substrate surface. The two basic types of stacked capacitor DRAM cells of the prior art are the Capacitor Under Bit line (CUB) structure shown in FIG. 1, and the Capacitor Over Bit line (COB) shown in FIG. 2.

Shown in FIG. 1 is a schematic cross-sectional view for the CUB structure. In this approach a field oxide (FOX) isolation, for example, a shallow trench isolation (STI) 12, is formed in a silicon substrate 10 surrounding and electrically isolating the cell area. An FET is formed next by thermally growing a gate oxide 14 on the active device area in an oxidizing atmosphere, and then depositing and patterning a polysilicon or polycide layer 16 to form the FET gate electrode 16. The FET lightly doped source/drain areas 17 are formed next by ion implantation, and an insulating layer 18 is deposited and anisotropically plasma etched back to form sidewall spacers 18. Optionally source/drain contact areas 19 are then formed by using a second ion implantation to complete the FET. The stacked storage capacitors are formed next after depositing an InterLevel Dielectric Layer (ILD), that is an insulating layer 20. Capacitor node contact holes, such as contact hole 2 in FIG. 1, are etched in layer 20 to one of the two source/drain areas 19 of each FET. (Only one of the many DRAM cells of the array of DRAM cells is depicted in FIG. 1.) The bottom capacitor electrode 22 making electrical contact 22' (node contact) in the contact hole 2 to the FET source/drain 19 is formed next by various means. For example, a single doped polysilicon layer 22 can be deposited and patterned to form the bottom electrode 22 for a block capacitor. Also, by including additional layers and process steps, crown-shaped capacitors, fin-shaped capacitors, and the like can be formed. The stacked capacitor is then completed by depositing a thin high-dielectric constant (high-k) interelectrode dielectric layer 24 and a top electrode 26 that is deposited and patterned. A second insulating layer 28 (InterMetal Dielectric (IMD) layer) is deposited to insulate the capacitor. Bit line contact holes, such as contact hole 4 in FIG. 1, are etched in layer 28 to the second FET source/drain area 19. The bit lines 30 are then formed by depositing and patterning a first metal layer, such as an aluminium/copper alloy having a barrier layer such as a titanium/titanium nitride, to make electrical contact 30' to the second source/drain area 19 to complete the array of DRAM cells. Optionally the bit lines can be a polycide (metal silicide/polysilicon layer), such as tungsten silicide ($WSi_2$) or titanium silicide ($TiSi_2$).

Unfortunately, the topography can be quite rough and leveling and planarizing techniques are employed to provide a planar surface on which submicrometer structures (e.g., bit lines) can be reliably formed. These planar surfaces are needed to expose the distortion-free photoresist images (patterns) because of the shallow depth of focus (DOF) required for the high-resolution lithography. The planar surface is also required to avoid residue (rails, fences, etc.) at steep steps when the next level of conducting layers is anisotropically plasma etched. Another problem is the high aspect ratio (height/width) of the bit line contact holes that can result in high contact resistance, or even result in electrical opens (broken bit lines).

Another method of making DRAM cells with stacked capacitors is shown in the schematic cross-sectional view in FIG. 2. These DRAM cells are referred to as Capacitor Over Bit line (COB), and are similar in fabrication to the CUB DRAM cells, and therefore the numbered elements are similarly labeled. However, in this COB structure, the bit lines 30, having bit line contacts 30' in the bit line contact holes 4 in insulating layer 20, are formed prior to forming the stacked capacitors. Although the bit line contact holes have reduced aspect ratios, the bit lines are usually formed from a lower electrical conductivity, high-melting-temperature material (e.g., doped polysilicon and silicides), since high-temperature processing is generally required to complete the stacked capacitors. However, the node contacts for the stacked capacitors require high-aspect-ratio node contact openings which are difficult to etch, and all the rough topography concerns of the CUB apply to the COB DRAM cell structure.

Another major concern in making stacked capacitors is that both the bit lines and capacitors are formed above the silicon surface. This is best illustrated in the schematic three-dimensional view of a COB DRAM cell in FIG. 3. As the DRAM cell continues to decrease in size, it becomes increasingly difficult to built both the bit line and capacitor in the same plane above the silicon substrate surface while keeping sufficient spacing between the bit line and stacked capacitor. FIG. 3 shows two COB DRAM cells having two adjacent crown capacitors 22 with a common bit line 30 fabricated up to the bottom electrodes 22. The insulating layers 20 and 28 of FIG. 2 are not shown to better depict the structure. As shown in FIG. 3, as the active device area 1 surrounded by the STI 12 becomes smaller to accommodate more memory cells on the DRAM device, the spacing between the bit line 30 and the stacked capacitor contacts 22' must be made smaller. This results in inadequate separations between the bit line and capacitor contacts which are formed in the same plane and can result in electrical shorts. Sometimes irregular shaped cell structures (twisted cell structures) are designed to maximize the separation, but typically result in irregular shaped FET gate electrodes that make it difficult to consistently control the FET channel length, and result in lower product yields.

An alternative method for making an array of DRAM cells is to use trench capacitors, as depicted for one of the DRAM cells in the schematic cross-sectional view of FIG. 4. By forming the storage capacitor in a trench etched in the silicon substrate, it is possible to leave the area above the substrate surface free for bit lines, thereby avoiding the separation problem associated with the CUB and COB DRAM devices. This also allows memory cells to be built with smaller surface areas for future high-density DRAM arrays.

The conventional trench capacitor DRAM cell is formed by first making the shallow trench isolation 12 (STI) in the silicon substrate 10 to isolate the active device areas. Deep vertical walled trenches, such as trench 5 in FIG. 4, are etched in the substrate and a high-dielectric-constant (k) insulator 32 is formed on the silicon surface in the trench 5. A conductively doped polysilicon layer is deposited and etched back to form the capacitor anode electrode 34 in the trench to form the capacitor. The FET (access transistor) is then formed adjacent to the trench capacitor in the conventional manner by first growing a gate oxide 14 on the device area. A polycide is deposited and patterned to form the gate electrode 16 and word lines (not shown). Lightly doped (LDD) source/drains areas 17, and insulating sidewall spacers 18, and optionally heavily doped source/drain areas 19 are then formed sequentially to complete the FET. A conducting layer is deposited and patterned to form the strap 36 to electrically short the capacitor polysilicon anode electrode 34 to one of the two source/drain areas 19. An insulating layer 20 is deposited and the bit line contact 4 is etched in layer 20. The array of DRAM cells is then completed by depositing and patterning a second polycide layer to form the bit lines 30.

However, there are several limitations with the current trench capacitor DRAM cell. For example, to achieve sufficient storage capacitance, the trench for making the capacitor is very deep (e.g., having aspect ratios of 20 to 40) and is difficult to etch and fill with the polysilicon. For future ULSI requirements, the DRAM trench aspect ratio is expected to increase further. Another shortcoming of this conventional trench capacitor process is that the trench cannot be extended in the cell area under the FET to take advantage of the increased capacitance derived therefrom.

One approach to using the area under the FET is described by J. M. Choi, U.S. Pat. No. 5,418,177, in which Choi forms a buried capacitor on a substrate and then forms an FET in a polysilicon layer deposited thereover, which forms a poorer transistor than can be formed in a single-crystal silicon. Another approach is described by McElroy, U.S. Pat. No. 4,896,293, in which the FETs are formed in the sidewall of the capacitor trench and the drain is formed on the top surface of the substrate to reduce cell size. Ishi, U.S. Pat. No. 5,112,771, etches a deep trench and then isotropically etches a portion of the silicon substrate at the bottom of the trench to increase the capacitance area.

Another approach for making trench capacitors with the FET over portions of the trench (to save cell space) is described in Wolf, Vol. 2, pages 609, and depicted in FIGS. 8–24 and 8–25 on page 611. The structure is a Self-aligned Epitaxy Over Trench (SEOT) cell which uses a double epitaxy process. After forming a storage electrode ($P^+$ polysilicon node electrode) completely isolated from the $P^+$ substrate, a selective epitaxy is used to laterally grow a single-crystal $P^-$ silicon over the $SiO_2$-isolated trench capacitor, but the epitaxial growth is stopped before the epitaxy has completely grown over the trench to form a self-aligned window. The $SiO_2$ in the window is etched to expose the $P^+$ polysilicon in the trench, and a second $P^-$ epitaxial layer is grown to form a pyramidal polysilicon in the window as the capacitor node contact for a P-channel FET memory cell. However, the multiple epitaxy is not cost effective; controlling the window size on 256 Mbit or 1 gigabit DRAM devices would be difficult to control; and the use of a $P^+$ storage electrode in a $P^+$ substrate is also more susceptible to leakage currents through the high-k dielectric.

There is still a strong need in the semiconductor industry to further improve upon fabricating trench storage capacitors for DRAM cells with increased capacitance while minimizing the depth of the capacitor trench (decreased aspect ratio) with improved reliability and cost performance.

SUMMARY OF THE INVENTION

Accordingly, it is a principal object of this invention to provide a structure and a method for fabricating an array of dynamic random access memory (DRAM) cells having trench capacitors with increased capacitance.

It is another object to make these DRAM cells with increased capacitance by fabricating novel buried horizontal trench capacitors with increased cell density on DRAM devices for future applications of high-density (gigabit) memory devices.

It is still another object of this invention to make these buried horizontal trench capacitors with an epitaxial layer thereon that allows the FET gate electrode and the shallow trench isolation to be built over the capacitor, thereby increasing DRAM cell density.

The improved DRAM cell structure takes advantage of forming the capacitors with increased horizontal dimensions in the substrate to increase the capacitance without having to etch exceptionally deep trenches with high aspect ratios (depth/width), as formed by the conventional method. The conventional straight deep trench can have aspect ratios of 20–40 or higher and, to further increase capacitance, aspect ratios are expected to increase further for future ULSI DRAM devices. As these straight deep trenches for capacitors become deeper, it is increasingly more difficult to etch and refill them. Further, the novel structure frees up space for making bit lines above the substrate surface, thereby allowing for reduced cell size. This novel DRAM structure provides an advantage over the stacked capacitor structure, in which the bit lines and the capacitor electrodes are both formed above the substrate surface that result in a more rough topography.

The method for fabricating an array of dynamic random access memory (DRAM) cells having these buried horizontal trench capacitors begins by providing a semiconductor substrate, such as a single-crystal silicon substrate doped with a P-type conductive dopant (e.g., boron). A first pad oxide and a first silicon nitride layer are deposited on the silicon substrate. Conventional photolithographic techniques and anisotropic etching are used to pattern the first silicon nitride layer, and the etching is continued to form capacitor trenches for the anode electrode of the buried capacitors in each of the DRAM cell areas on the substrate where the buried horizontal trench capacitors are to be formed. The capacitor trenches can be extended not only in the vertical direction (z-direction) perpendicular to the silicon surface, but can also take advantage of the horizontal direction (x-y direction) to form an inverted mushroom-shaped structure that further increases the capacitance. Continuing, a conformal thin first dielectric layer, having a high-dielectric constant, is formed on the surface of the silicon substrate in the capacitor trenches. For example, a silicon oxide/silicon nitride/silicon oxide (ONO) can be used. A blanket conformal first polysilicon layer, sufficiently thick to fill the trenches, is deposited and is chemically/mechanically polished back to expose the top surface of the silicon substrate, leaving portions of the first polysilicon layer in the capacitor trenches that are essentially coplanar with the silicon substrate surface. A second dielectric layer, having a high dielectric constant, is formed on the silicon substrate and over the first polysilicon layer in the capacitor trenches. The second dielectric layer is patterned leaving portions over the first polysilicon and extending over and beyond the edges of the first dielectric layer and onto the silicon substrate.

An epitaxial silicon layer is grown on the silicon substrate which also grows laterally extending over the second dielectric layer on the first polysilicon in the trenches. Concurrently, this non-selective epitaxy results in an amorphous silicon layer (alpha-Si) growing on the second dielectric layer. The lateral growth of the epitaxial silicon layer results in an alpha-Si layer with decreasing top surface area over the polysilicon-filled trenches. This epitaxial/amphorus silicon layer extending over the trenches allows the FET gate electrodes and a shallow trench isolation to be formed over the capacitor trenches, thereby increasing DRAM cell density.

Continuing with the process, Field OXide (FOX) isolation regions are formed surrounding and electrically isolating active device areas over the buried horizontal trench capacitors using a second pad oxide and a second silicon nitride layer over the active device areas. Shallow trench isolation (STI) is used for the FOX, although it should be understood that the more conventional LOCal oxidation Of Silicon (LOCOS) method can also be used. Using a photoresist mask and anisotropic plasma etching, node contact holes are etched in the second silicon nitride layer, the second pad oxide layer, and through the epitaxial/amphorus silicon layer to the second dielectric layer. After removing the photoresist, an insulating liner is then formed on the sidewalls of the epitaxy/amorphous silicon layer in the node contact holes. Anisotropic plasma etching is then used to remove the second dielectric layer in the node contact holes exposing the first polysilicon in the horizontal trench capacitors. A doped second polysilicon layer is deposited to fill the node contact holes. The second polysilicon layer is then etched back or chemically/mechanically polished back to the second silicon nitride layer to form anode electrical contacts, while the silicon nitride protects the active device areas. This completes the array of buried horizontal trench capacitors.

Continuing, the array of DRAM cells is formed by removing the second silicon nitride layer and the second pad oxide layer, and by growing an FET gate oxide on the device areas. A first polycide layer is deposited and patterned to form the FET gate electrodes on the device areas extending over the horizontal trench capacitors and adjacent to the anode electrical contact, resulting in reduced DRAM cell size. The patterned first polycide layer concurrently forms word lines over the shallow trench isolation regions. Lightly doped source/drain areas are formed adjacent to the gate electrodes by ion implantation. Sidewall spacers are formed on the sidewalls of the FET gate electrodes by depositing and etching back a conformal insulating layer. Heavily doped source/drain contact areas are implanted adjacent to the sidewall spacers to form FET access transistors for the array of DRAM cells. One of the source/drain areas of each FET extends over one of the anode electrical contacts of the horizontal trench capacitors. A node strap is formed by depositing and patterning a conducting layer over the insulating liner to form an electrical connection between the source/drain contact area and the anode electrical contact. A polysilicon/metal dielectric (PMD) layer is deposited to electrically insulate the FET gate electrodes and the source/drain areas. Bit line contact holes are etched in the PMD layer to the second source/drain area of each FET. The array of DRAM cells is then completed by depositing and patterning a second polycide layer to form bit lines.

BRIEF DESCRIPTION OF THE DRAWINGS

The objects and advantages of this invention are best understood with reference to the attached drawings in the FIGS. and the embodiment that follows.

FIG. 1 shows a schematic cross-sectional view of the prior art for a DRAM cell for a Capacitor Under Bit line (CUB) in which both the stacked capacitor and bit line are made above the silicon surface.

FIG. 2 shows a schematic cross-sectional view of the prior art for a DRAM cell for a Capacitor Over Bit line (COB) in which both the stacked capacitor and bit line are made above the silicon surface.

FIG. 3 shows a schematic three-dimensional view of the prior art for a stacked Capacitor Over Bit line (COB) depicting the problem in forming the bit line and capacitor over the same cell area.

FIG. 4 shows a schematic cross-sectional view of the prior art for a DRAM cell depicting a conventional trench capacitor requiring a deep trench for increased capacitance as the cell size decreases.

DESCRIPTION OF THE PREFERRED EMBODIMENT

The novel DRAM cell structure and method for making a high-density array of DRAM cells having these novel buried horizontal capacitors using a single epitaxial silicon layer extending over the buried capacitor is described in detail. The DRAM cells are formed using N-channel field effect transistors (N-FETs) as the access transistors in each of the memory cells that is formed in and on the P⁻ epitaxial layer over the buried horizontal capacitors. This allows the invention to utilize the space under the device areas to make buried capacitors having increased capacitance while reducing the cell area. It should also be well understood by one skilled in the art that by including additional process steps, in addition to those described in this embodiment, other types of devices can also be included on the DRAM chip. For example, by forming N-doped well regions in the P-doped epitaxy on the substrate, P-channel FETs can also be provided from which Complementary Metal-Oxide-Semiconductor (CMOS) circuits can be formed, such as are used for the peripheral circuits on the DRAM chip.

Figure 5:
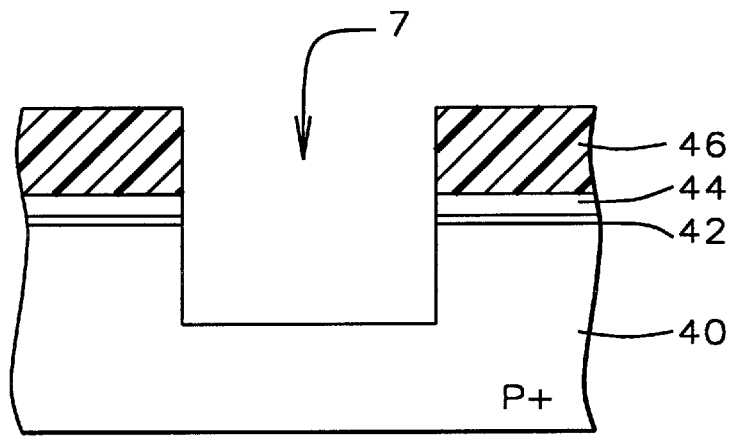
FIGS. 5 through 12 show schematic cross-sectional views of the present invention for making a DRAM cell with a buried horizontal trench capacitor.
Figure 10:
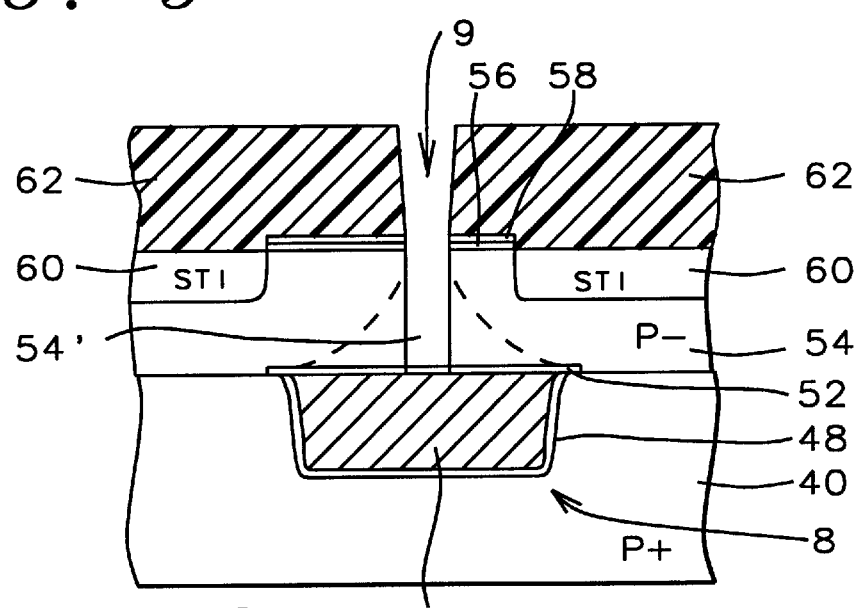
Figure 11:
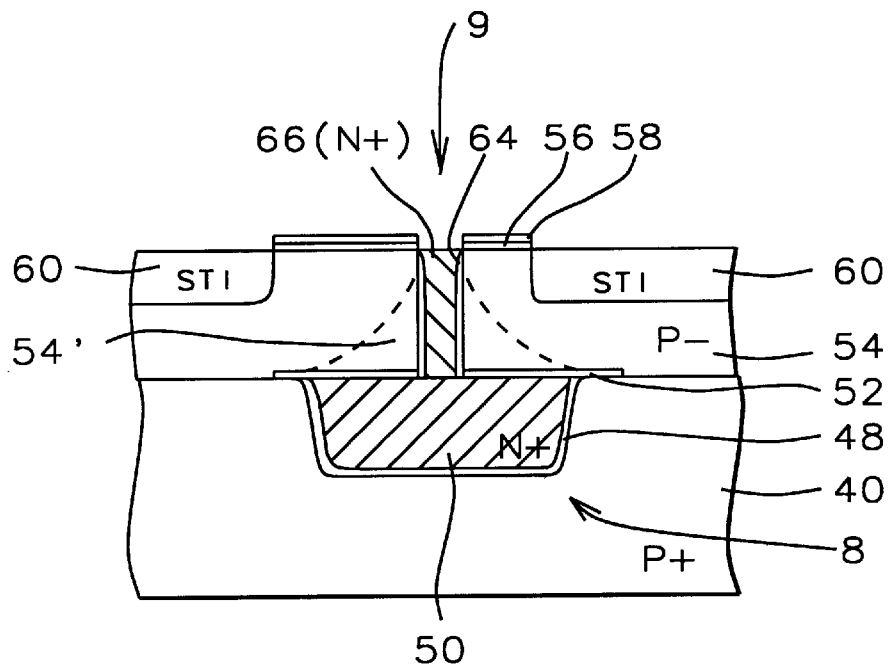
Figure 12:
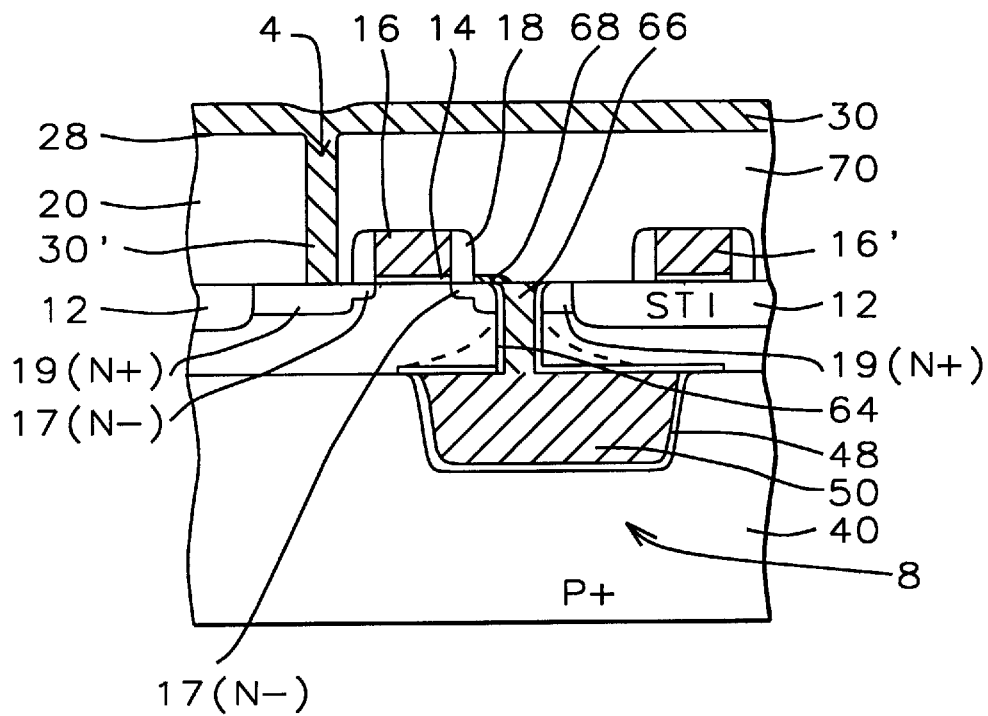

Referring to FIGS. 5–11, the processing steps for forming a novel buried horizontal trench capacitor for a DRAM cell are described in detail, while FIG. 12 depicts the processing steps for forming a new DRAM cell using this novel storage capacitor. FIG. 5 shows the schematic cross-sectional view for the initial processing steps for making one of the novel capacitors in a dynamic random access memory (DRAM) cell. The method for the buried horizontal trench capacitor begins by providing a semiconductor substrate 40. The substrate 40 is preferably a single-crystal silicon substrate that is P⁺ conductively doped (e.g., boron). A first pad oxide 42 composed of silicon oxide ($SiO_2$) is formed on the substrate, for example by thermal oxidation. The thickness of layer 42 is preferably between about 20 and 300 Angstroms. A first silicon nitride layer 44 is deposited next, for example by low-pressure chemical vapor deposition (LPCVD) using a reactant gas of dichlorosilane ($SiCl_2H_2$) and ammonia ($NH_3$). The silicon nitride ($Si_3N_4$) is deposited to a preferred thickness of between about 50 and 1000 Angstroms.

A photoresist mask 46 and anisotropic plasma etching are used to etch capacitor trench areas for the buried horizontal trench capacitors in regions under the device areas that will be formed later. The first $Si_3N_4$ layer 44 and the first pad oxide layer 42 are anisotropically plasma etched in a high-density plasma (HDP) etcher or in a reactive ion etcher using a gas containing fluorine (F), such as carbon tetrafluoride ($CF_4$). The etching is continued to form a capacitor trench 7 in the P⁺ substrate 40 in which the capacitor anode electrode will be formed. Preferably the trench 7 is etched using anisotropic plasma etching and a reactant gas mixture containing chlorine ($Cl_2$). The trench 7 can be extended not only in the vertical direction (z-direction) perpendicular to the silicon surface, as in the prior art, but can also be extended in the horizontal direction (x-y direction) to form an inverted mushroom-shaped structure that further increases the capacitance by taking advantage of the space underneath the cell area. Further, the capacitance can be increased by increasing the depth of the trench. For example, trench 7 can be etched to a depth of at least 0.2 micrometers (um).

Figure 6:
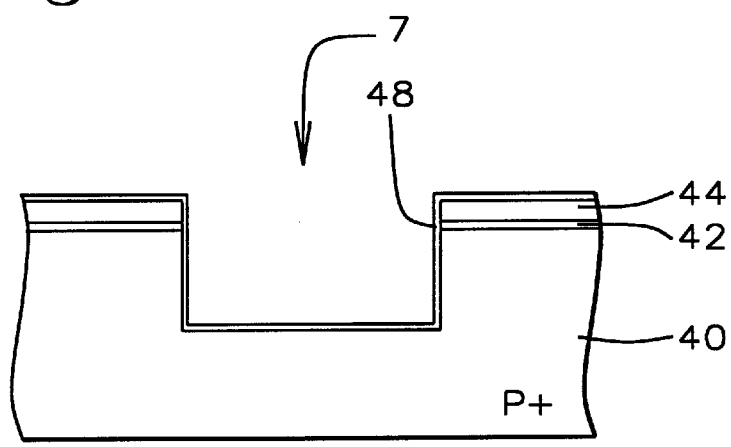

Referring next to FIG. 6, the photoresist (layer 46 in FIG. 5) is stripped and a conformal first dielectric (high-k dielectric) layer 48 is formed on the surface of the silicon substrate in the trench 7. For example, the first dielectric layer 48 can be composed of a silicon oxide/silicon nitride/silicon oxide (ONO). One method for forming the ONO is to thermally oxidize the silicon substrate surface in the trench 7, and to deposit a $Si_3N_4$ layer which is then partially converted to a $SiO_2$ by a thermal annealing in oxygen ($O_2$). Preferably the thickness of ONO layer 48 is between about 20 and 100 Angstroms. Alternatively, other high-k dielectrics, such as tantalum pentoxide ($Ta_2O_5$) and the like, can be used.

Figure 7:
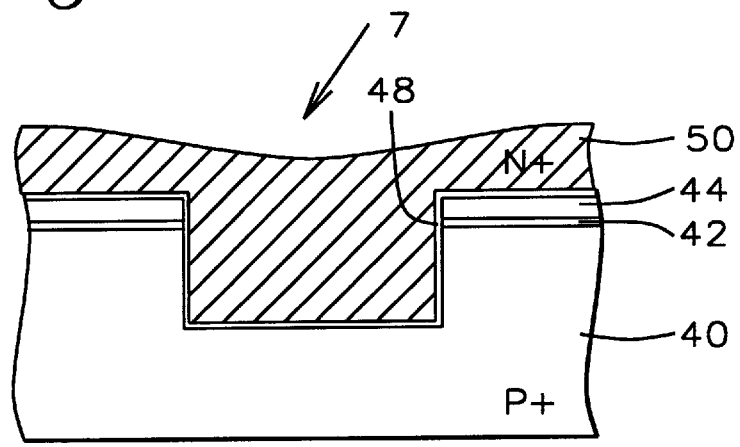

Referring now to FIG. 7, a blanket conformal first polysilicon layer 50, sufficiently thick to fill the trench 7, is deposited. The polysilicon layer 50 is deposited to a thickness that is at least greater than the depth of trench 7. Layer 50 is deposited, for example, by LPCVD and using a reactant gas, such as silane ($SiH_4$). Layer 50 is doped N⁺ by in-situ doping with phosphorus using a dopant such as phosphine ($PH_3$) during the polysilicon deposition, and is doped to a preferred concentration of between about 1.0 E 19 and 1.0 E 21 atoms/cm³.

Figure 8:
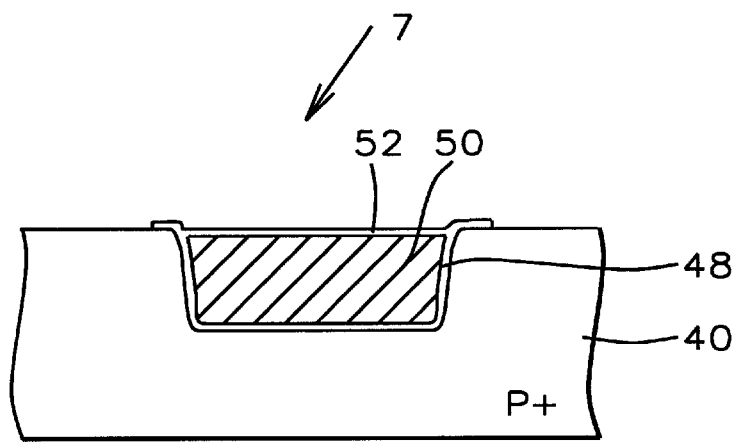

Referring to FIG. 8, the first polysilicon layer 50 is chemically/mechanically polished (CMP) back to expose the top surface of the silicon substrate 40, leaving portions of the first polysilicon in the trench 7 that are essentially coplanar with the surface of the silicon substrate 40. The polishing is carried out using commercially available polishing equipment and slurries, as commonly practiced in the semiconductor industry.

Next, a second (high-k) dielectric layer 52 is formed on the silicon substrate 40 and over the first polysilicon layer 50. For example, a silicon oxide/silicon nitride/silicon oxide (ONO) layer can be used as described above for the first dielectric layer 48. The thermal oxidation used to form the second ONO also serves to remove any polishing damage after the CMP. The second dielectric layer 52 is patterned leaving portions over the first polysilicon 50 in the trench 7 and extending over and beyond the edges of the first dielectric layer 48 and onto the silicon substrate 40, as shown in FIG. 8. The dielectric layer 52 can be patterned using a photoresist mask and a wet etch in a dilute hydrofluoric (HF) acid solution to remove the $SiO_2$, and a hot phosphoric acid etch to remove the $Si_3N_4$.

Figure 9:
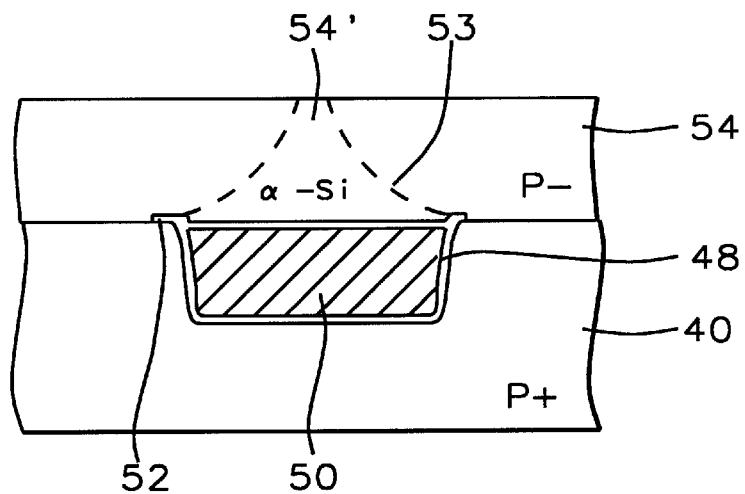

Referring now to FIG. 9, a key feature of the invention is to grow a non-selective epitaxial silicon layer 54 on the silicon substrate 40 and concurrently growing an amorphous silicon (alpha-Si) layer 54' over the second dielectric layer 52 on the polysilicon-filled trench 7. The epitaxy layer 54 grows laterally extending over the second dielectric layer 52, while the non-selective epitaxy results in the amorphous silicon layer (alpha-Si) 54' that grows on the second dielectric layer 52 with a decreasing top surface area over the polysilicon-filled trench 7, as depicted by the dashed lines 53 in FIG. 9. The epitaxy/amorphous silicon layer 54 (which includes amorphous layer 54') can be formed in a commercially available epitaxial reactor. The epitaxial/amorphous silicon layer 54 is grown to a thickness of between about 200 and 5000 Angstroms. Layer 54 is doped in situ with diborane hydride ($B_2H_6$) to form a P⁻ doped epitaxial layer having a boron concentration of between about 1.0 E 15 and 1.0 E 18 atoms/cm³. This epitaxial layer extending over the polysilicon-filled capacitor trench allows a DRAM FET gate electrode and a shallow trench isolation to be formed above the capacitor trench, thereby increasing DRAM cell density with increased capacitance.

Referring now to FIG. 10, a second pad oxide layer 56 and a second $Si_3N_4$ layer 58 are deposited similar to the deposition of the first pad oxide and first $Si_3N_4$ layers. Layers 58 and 56 are then patterned using a photoresist mask (not shown) and plasma etching, leaving portions of layer 58 over the desired active device areas. The Field OXide (FOX) isolation regions 60 are formed surrounding and electrically isolating active device areas over the buried horizontal trench capacitor. The FOX can be formed by the conventional LOCal oxidation Of Silicon (LOCOS) method, but preferably, for high-density DRAM devices, a shallow trench isolation (STI) is used for the FOX. One method commonly used in the industry is to etch a shallow trench which is thermally oxidized and filled with a CVD silicon oxide ($SiO_2$) 60. The CVD oxide 60 is then chemically/mechanically polished back or etched back to the second $Si_3N_4$ surface, as shown in FIG. 10, to form an essentially coplanar surface with the device areas. The STI is formed to a preferred depth of between about 0.10 and 1.0 um.

Still referring to FIG. 10, conventional photolithography using a photoresist mask 62 and anisotropic plasma etching are used to etch the node contact hole 9 in the second $Si_3N_4$ layer and in the alpha-Si layer 54' to the second dielectric layer 52 over the anode node electrode 50. Preferably node contact hole 9 is etched using reactive ion etching (RIE) or high-density plasma (HDP) etching. The second $Si_3N_4$ layer 58 and cap oxide layer 56 can be etched using an etchant gas having fluorine species such as $CCl_2F_2$, $CHF_3$, $CF_4/H_2$, $CH_3CHF_2$, and the like, while the alpha-Si can be etched using an etchant gas such as $Cl_2$, or other gases containing chlorine or bromine, such as $BCl_2/CCl_4$, $BCl_3/CF_4$, and the like.

Referring now to FIG. 11, after removing the photoresist mask 62 and prior to removing the second $Si_3N_4$ layer 58, a liner oxide 64 is formed on the sidewalls of the node contact hole 9 by thermal oxidation, while the second $Si_3N_4$ on the device areas and the $Si_3N_4$ in the second dielectric layer 52 (in FIG. 10) prevent oxidation. The liner 64 is preferably a high-k dielectric such as ONO and deposited to a thickness of between about 20 and 100 Angstroms. Alternatively $Ta_2O_5$ can be used as the liner. An anisotropic plasma etching is then used to selectively remove the high-k dielectrics 64 and 52 in the node contact hole.

Still referring to FIG. 11, a second polysilicon layer 66 is deposited by LPCVD and polished back to form the anode node contact 66 in the contact hole 9 to the anode plate of the buried horizontal trench capacitor. The silicon nitride layer 58 and the FOX 60 protect the silicon substrate during the polish back or etch back. Preferably layer 66 is deposited to a thickness greater than ½ the width of the contact hole 9 to completely fill the contact hole. Layer 66 is in-situ doped with phosphorus (P) using, for example, phosphine ($PH_3$) during the polysilicon LPCVD to a dopant concentration of between about 1.0 E 19 and 1.0 E 22 atoms/$cm^3$.

Referring to FIG. 12, the array of DRAM cells is completed by forming the pass transistors and the bit lines. A key feature of this invention is that the FET in each cell can now be formed in and on the epitaxial layer 54 over the trench capacitor, thereby reducing the cell size while increasing the capacitance.

Continuing with the process, the second Si3N4 layer 58 and the second pad oxide layer 56 (FIG. 11) are removed from the device areas. The $Si_3N_4$ layer 58 is removed using a hot phosphoric acid ($H_3PO_4$) etch, and the pad oxide can be removed in a dilute hydrofluoric (HF) acid solution. An FET gate oxide 14 is formed on the device area, for example, by thermal oxidation in a dry oxygen ambient. Preferably the oxide 14 is grown to a thickness of between about 20 and 100 Angstroms. The FET gate electrode 16 and word lines 16' are formed next by depositing a polysilicon layer and a tungsten silicide ($WSi_2$) layer to form a first polycide layer 16, which is then patterned. The first polycide layer 16 can be formed, for example, by depositing a LPCVD $N^+$ doped polysilicon layer to a thickness of between about 500 and 3500 Angstroms, and a $WSi_2$ layer having a thickness of between about 500 and 2000 Angstroms. Typically the polysilicon is doped with arsenic or phosphorus by ion implantation to a dopant concentration of between about 1.0 E 19 and 1.0 E 21 atoms/$cm_3$. The $WSi_2$ layer can be deposited using LPCVD and tungsten hexafluoride ($WF_6$) and silane ($SiH_4$) as the reactant gases.

Conventional photolithography and anisotropic plasma etching are used to pattern the polycide layer to form the FET gate electrode 16 and concurrently to form the word lines 16' over the shallow trench isolation regions 60, as shown in FIG. 12. By the method of this invention, the gate electrode 16 can be formed extending over the buried horizontal trench capacitor 8, which further reduces the DRAM cell size. The gate electrode 16 is also formed adjacent to the anode electrical contact 66. Lightly doped source/drain areas 17 are formed adjacent to the gate electrodes by ion implantation. For an N-channel FET commonly used in a DRAM cell, lightly doped source/drain areas can be made by implanting arsenic ($As^{75}$) or phosphorus ($P^{31}$) at an ion implant dose of between about 1.0 E 13 and 1.0 E 15 ions/$cm^2$ and an ion implant energy of about 15 to 40 KeV. Sidewall spacers 18 are then formed on the sidewalls of the FET gate electrode 16 by depositing and etching back a conformal insulating layer, such as $SiO_2$. Heavily doped source/drain contact areas 19 are formed next by implanting $As^{75}$ adjacent to the sidewall spacers to complete the FET access transistor for the DRAM cell. Preferably the source/drain contact areas 19 are formed by ion implantation to achieve a dopant concentration of between about 1.0 E 19 and 1.0 E 21 atoms/$cm^3$. One of the source/drain areas 19 of the FET is formed to extend over the anode contact 66 of the buried horizontal trench capacitor 8. A node strap 68 is formed by depositing and patterning a conducting layer over the insulating liner 64 to form a good electrical connection between the source/drain contact area 19 and the anode contact 66. For example, the node strap can be formed by depositing titanium (Ti), titanium nitride (TiN), tungsten silicide ($WSi_2$), or other metal silicides to a thickness of between about 50 and 1000 Angstroms, which is then patterned by either plasma etching or wet etching.

A polysilicon/metal dielectric (PMD) layer 70 is deposited to electrically insulate the FET gate electrode 16 and the source/drain areas 19. Preferably layer 70 is a $SiO_2$ deposited by CVD to a thickness of between about 1000 and 5000 Angstroms. Further, layer 70 can be planarized to provide a surface on which distortion-free photoresist images can be formed, and to improve the subsequent patterning of the next level of interconnections (bit lines) without leaving residue between the lines. Bit line contact holes 4 are etched in the PMD layer 70 to the second source/drain area 19 of each FET. The array of DRAM cells is then completed by depositing and patterning a second polycide layer 30 to form bit lines. For example, the polycide layer 30 is composed of an $N^+$ doped polysilicon layer having a thickness of between about 250 and 2000 Angstroms, and a $WSi_2$ layer having a thickness of between about 200 and 2000 Angstroms. The polysilicon can be deposited by LPCVD using, for example, a reactant gas such as $SiH_4$, and is doped with phosphorus or arsenic to a concentration of between about 1.0 E 19 and 1.0 E 21 atoms/$cm^3$. The $WSi_2$ of the second polycide layer 30 can be deposited by LPCVD using $WF_6$ and $SiH_4$. Layer 30 is patterned by anisotropic plasma etching to form the bit lines.

While the invention has been particularly shown and described with reference to the preferred embodiment thereof, it will be understood by those skilled in the art that various changes in form and details may be made without departing from the spirit and scope of the invention.

What is claimed is:

1. A buried horizontal trench capacitor comprised of:
   a $P^+$ substrate having a capacitor trench etched therein, said trench is etched only in said $P^+$ substrate;
   a first dielectric layer on the surface in said capacitor trench, and said capacitor trench filled with a first polysilicon layer;
   a patterned second dielectric layer over said first polysilicon layer in said capacitor trench and said second dielectric layer extending over said first dielectric layer on sidewalls of said capacitor trench;
   a $P^-$ epitaxial layer on said $P^+$ substrate extending laterally inward over said patterned second dielectric layer;
   said $P^-$ epitaxy layer having a vertical node contact hole extending downward to said first polysilicon layer in said capacitor trench, and having an insulating liner on sidewalls in said node contact hole;
   a second polysilicon layer in said node contact holes providing node contacts to said first polysilicon layer in said capacitor trench, and thereby providing a buried horizontal trench capacitor.

2. The structure of claim 1, wherein said buried horizontal trench capacitor has a field effect transistor (FET) formed thereon having a first source/drain contact contacting said node contacts;
   a bit line contacting a second source/drain contact of said field effect transistor and thereby providing a memory cell.

3. The structure of claim 2, wherein said field effect transistor is a metal-oxide-semiconductor (MOS) field effect transistor comprised of a gate electrode, a gate oxide, a lightly doped drain, and source/drain contact areas.

4. The structure of claim 1, wherein said $P^+$ substrate is a single-crystal silicon and is doped $P^+$ with boron.

5. The structure of claim 1, wherein said first and second polysilicon layers are $N^+$ doped with phosphorus.

6. The structure of claim 1, wherein said $P^-$ epitaxial layer is doped with boron (B) having a dopant concentration of between about 1.0 E 15 and 1.0 E 18 atoms/cm$^3$.

7. The structure of claim 1, wherein said $P^-$ epitaxial layer has a thickness of between about 200 and 5000 Angstroms.

8. The structure of claim 1, wherein said capacitor trench has a depth of at least about 0.2 micrometers.

9. A dynamic random access memory (DRAM) cell with a buried horizontal trench capacitor comprised of:
   a $P^+$ substrate having a capacitor trench etched therein, said trench is etched only in said P+ substrate;
   a first dielectric layer on the surface in said capacitor trench, and said capacitor trench filled with a first polysilicon layer;
   a patterned second dielectric layer over said first polysilicon layer in said capacitor trench and said second dielectric layer extending over said first dielectric layer on sidewalls of said capacitor trench;
   a $P^-$ epitaxial layer on said $P^+$ substrate is extending laterally inward over said patterned second dielectric layer;
   said $P^-$ epitaxy layer having a vertical node contact hole extending downward to said first polysilicon layer in said capacitor trench, and having an insulating liner on sidewalls in said node contact hole;
   a second polysilicon layer in said node contact holes providing node contacts to said first polysilicon layer in said capacitor trench, and thereby providing a buried horizontal trench capacitor, and further
   a field effect transistor (FET) in said epitaxy layer over said buried horizontal trench capacitor having a first source/drain contact contacting said node contacts;
   a bit line contacting a second source/drain contact of said field effect transistor and thereby providing a DRAM cell.

10. The structure of claim 9, wherein said field effect transistor is a metal-oxide-semiconductor (MOS) field effect transistor comprised of a gate electrode, a gate oxide, a lightly doped drain, and source/drain contact areas.

11. The structure of claim 9, wherein said $P^-$ epitaxial layer is doped with boron (B) having a dopant concentration of between about 1.0 E 15 and 10 E 18 atoms/cm$^3$.

12. The structure of claim 9, wherein said $P^-$ epitaxial layer has a thickness of between about 200 and 5000 Angstroms.

* * * * *